(12) United States Patent
Xiao et al.

(10) Patent No.: US 11,994,810 B2
(45) Date of Patent: May 28, 2024

(54) ALIGNMENT MARK, MASK AND DISPLAY SUBSTRATE MOTHERBOARD

(71) Applicant: BOE TECHNOLOGY GROUP CO., LTD., Beijing (CN)

(72) Inventors: Li Xiao, Beijing (CN); Jiao Zhao, Beijing (CN); Dongni Liu, Beijing (CN); Minghua Xuan, Beijing (CN); Haoliang Zheng, Beijing (CN); Liang Chen, Beijing (CN); Hao Chen, Beijing (CN); Zhenyu Zhang, Beijing (CN); Jing Liu, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 959 days.

(21) Appl. No.: 16/966,874

(22) PCT Filed: Nov. 29, 2019

(86) PCT No.: PCT/CN2019/122047
§ 371 (c)(1),
(2) Date: Jul. 31, 2020

(87) PCT Pub. No.: WO2021/102934
PCT Pub. Date: Jun. 3, 2021

(65) Prior Publication Data
US 2022/0373900 A1 Nov. 24, 2022

(51) Int. Cl.
G03F 9/00 (2006.01)
G03F 1/42 (2012.01)

(52) U.S. Cl.
CPC ............. *G03F 9/7084* (2013.01); *G03F 1/42* (2013.01); *G03F 9/7076* (2013.01)

(58) Field of Classification Search
CPC .... G03F 9/7084; G03F 9/7076; G03F 9/7003; G03F 1/42; G03F 1/1333; G03F 7/70633;
(Continued)

(56) References Cited

U.S. PATENT DOCUMENTS 6,042,976 A 3/2000 Chiang et al.
8,017,424 B2 * 9/2011 Crespin ............... G03F 7/70633
438/55

(Continued)

FOREIGN PATENT DOCUMENTS

CN 102650819 A 8/2012
CN 103698934 A 4/2014
(Continued)

OTHER PUBLICATIONS

Extended European Search Report dated Dec. 9, 2022 issued in the corresponding European Patent Application No. 19946242.5.

*Primary Examiner* — Nikolay K Yushin
(74) *Attorney, Agent, or Firm* — The Webb Law Firm

(57) ABSTRACT

An alignment mark includes a first alignment marker located on a first surface of a substrate and a second alignment marker located on a second surface of the substrate. The second alignment marker is arranged to be matched with the first alignment marker, and capable of representing a process variation between the second alignment marker and the first alignment marker.

15 Claims, 12 Drawing Sheets

(58) Field of Classification Search
CPC .......... G03F 7/00; G03F 7/70683; G03F 9/00; G02F 1/133351; G02F 1/1333; G02F 1/133354; H05K 1/0269; H05K 1/111; H05K 1/11; H05K 2203/1572; H05K 2203/166; H05K 2203/1469; H01L 23/544; H01L 23/56; H01L 23/5258; H01L 2223/54426; H01L 2223/54453; H01L 2223/54493

See application file for complete search history.

(56) References Cited

U.S. PATENT DOCUMENTS

| | | | |
|---|---|---|---|
| 2007/0170603 A1 | | 7/2007 | Takahashi et al. |
| 2010/0301500 A1 | | 12/2010 | Louh |
| 2011/0058731 A1 | * | 3/2011 | Crespin ................ G03F 9/7084 |
| | | | 382/151 |
| 2017/0090228 A1 | * | 3/2017 | Ishikawa ............... G02F 1/1339 |
| 2019/0229066 A1 | | 7/2019 | Chang et al. |

FOREIGN PATENT DOCUMENTS

| | | |
|---|---|---|
| CN | 104078446 A | 10/2014 |
| CN | 106773525 A | 5/2017 |
| CN | 110071093 A | 7/2019 |

\* cited by examiner

US 11,994,810 B2

ALIGNMENT MARK, MASK AND DISPLAY SUBSTRATE MOTHERBOARD

CROSS-REFERENCE TO RELATED APPLICATION

This application is a national phase entry under 35 USC 371 of International Patent Application No. PCT/CN2019/122047 filed on Nov. 29, 2019, which is incorporated herein by reference in its entirety.

TECHNICAL FIELD

The present disclosure relates to the field of display technologies, and in particular to an alignment mark, a mask and a display substrate motherboard.

BACKGROUND

With the continuous development of display technologies, demands of consumers for various display devices such as laptop computers, smart phones, TV sets, tablet computers, smart watches and fitness wristbands are increasing. For example, the consumers require better viewing experience. Thus, a full screen technology is used in display devices, so that the display devices have an ultrahigh screen-to-body ratio, and bezels of the display devices may be reduced or even eliminated, thereby realizing a bezel-less display of the display devices and ensuring that the display devices have good display effects.

SUMMARY

In one aspect, an alignment mark is provided. The alignment mark includes a first alignment marker located on a first surface of a substrate and a second alignment marker located on a second surface of the substrate. The second alignment marker is arranged to be matched with the first alignment marker, and capable of representing a process variation between the second alignment marker and the first alignment marker.

In some embodiments, the first alignment marker includes at least one first reference line and at least one second reference line. An extension direction of a first reference line is perpendicular or approximately perpendicular to an extension direction of a second reference line. The second alignment marker includes a first alignment pattern in one-to-one correspondence to the at least one first reference line and a second alignment pattern in one-to-one correspondence to the at least one second reference line.

In some embodiments, the first alignment pattern includes a plurality of first alignment blocks distributed in a V shape, and a symmetrical centerline of the first alignment pattern is parallel to the first reference line; and the second alignment pattern includes a plurality of second alignment blocks distributed in, a V shape, and a symmetrical centerline of the second alignment pattern is parallel to the second reference line.

In some embodiments, the second alignment marker further includes a plurality of first direction displacement value markers located beside the first alignment pattern and a plurality of second direction displacement value markers located beside the second alignment pattern.

In some embodiments, the first alignment pattern includes a plurality of first alignment blocks distributed in a V shape, and a symmetrical centerline of the first alignment pattern is parallel to the first reference line. The second alignment pattern includes a plurality of second alignment blocks distributed in a V shape, and a symmetrical centerline of the second alignment pattern is parallel to the second reference line. The plurality of first alignment blocks are in one-to-one correspondence to the plurality of first direction displacement value markers, and the plurality of second alignment blocks are in one-to-one correspondence to the plurality of second direction displacement value markers.

In some embodiments, a shape of each of the plurality of first alignment blocks includes a rectangle, a triangle or a rhombus; and a shape of each of the plurality of second alignment blocks includes a rectangle, a triangle or a rhombus.

In some embodiments, each of the plurality of first alignment blocks has a dimension within a range from 30 μm to 50 μm in the extension direction of the first reference line, and a dimension within a range from 2 μm to 10 μm in a perpendicular direction of the first reference line. Each of the plurality of second alignment blocks has a dimension within a range from 30 μm to 50 μm in the extension direction of the second reference line, and a dimension within a range from 2 μm to 10 μm in a perpendicular direction of the second reference line.

In some embodiments, in a perpendicular direction of the first reference line, a space between two first alignment blocks that are located on a bottom of the V shape, arranged side-by-side and adjacent to each other, in the plurality of first alignment blocks is equal or approximately equal to a line width of the first reference line; and a space between two first alignment blocks that are located on a top of the V shape, arranged side-by-side and adjacent to each other, in the plurality of first alignment blocks is less than or equal to a sum of the line width of the first reference line and 2 times a maximum value of the process variation. In a perpendicular direction of the second reference line, a space between two second alignment blocks that are located on a bottom of the V shape, arranged side-by-side and adjacent to each other, in the plurality of second alignment blocks is equal or approximately equal to a line width of the second reference line; and a space between two second alignment blocks that are located on a top of the V shape, arranged side-by-side and adjacent to each other, in the plurality of second alignment blocks is less than or equal to a sum of the line width of the second reference line and 2 times a maximum value of the process variation.

In some embodiments, each of the plurality of first direction displacement value markers is an Arabic numeral or Roman numeral, and the first direction displacement value marker is a value of the process variation represented when a space between a corresponding first alignment block and the first reference line is zero or proximate to zero. Each of the plurality of second direction displacement value markers is an Arabic numeral or Roman numeral, and the second direction displacement value marker is a value of the process variation represented when a space between a corresponding second alignment block and the second reference line is zero or proximate to zero.

In some embodiments, a difference value between two adjacent first direction displacement value markers in the plurality of first direction displacement value markers is within a range from 0.5 μm to 2 μm. A difference value between two adjacent second direction displacement value markers in the plurality of second direction displacement value markers is within a range from 0.5 μm to 2 μm.

In some embodiments, the first alignment marker includes a solid circle. The second alignment marker includes a plurality of circular rings that have a same center and are nested in a radial direction. A circular ring having a minimum inner diameter in the plurality of circular rings is a reference ring, and the inner diameter of the reference ring is equal or approximately equal to a diameter of the solid circle.

In some embodiments, the second alignment marker further includes third displacement value markers located beside each circular ring. Each third displacement value marker is a value of the process variation, in the radial direction, represented when a space between an inner diameter or outer diameter of a corresponding circular ring and an outer diameter of the solid circle is zero or proximate to zero.

In some embodiments, a material for the first alignment marker includes a light-shielding material having a light transmittance less than or equal to 10%, and a material for the second alignment marker includes a light-shielding material having a light transmittance less than or equal to 10%.

In another aspect, a mask is provided. The mask has a pattern of at least the first alignment marker described in some above embodiments.

In yet another aspect, another mask is provided. The mask has a pattern of at least one second alignment marker described in some above embodiments.

In yet another aspect, a display substrate motherboard is provided. The display substrate motherboard includes a substrate and at least one alignment mark described in some above embodiments. The substrate includes at least one display area and a non-display area located on at least one side of the at least one display area. The at least one alignment mark is located in the non-display area.

In some embodiments, at least one first signal line is disposed on a first surface of the substrate, and the first alignment marker and the at least one first signal line are disposed in a same layer. At least one second signal line is disposed on a second surface of the substrate, and the second alignment marker and the at least one second signal line are disposed in a same layer.

BRIEF DESCRIPTION OF THE DRAWINGS

In order to explain technical solutions in some embodiments of the present disclosure more clearly, the accompanying drawings to be used in some embodiments of the present disclosure will be introduced briefly. Obviously, the accompanying drawings to be described below are merely accompanying drawings for some embodiments of the present disclosure, and a person of ordinary skill in the art may obtain other drawings according to these drawings. In addition, the accompanying drawings to be described below may be considered as schematic views and are, not intended to limit the actual size of products and the actual flow of the method involved in some embodiments of the present disclosures.

DETAILED DESCRIPTION

Figure 1:
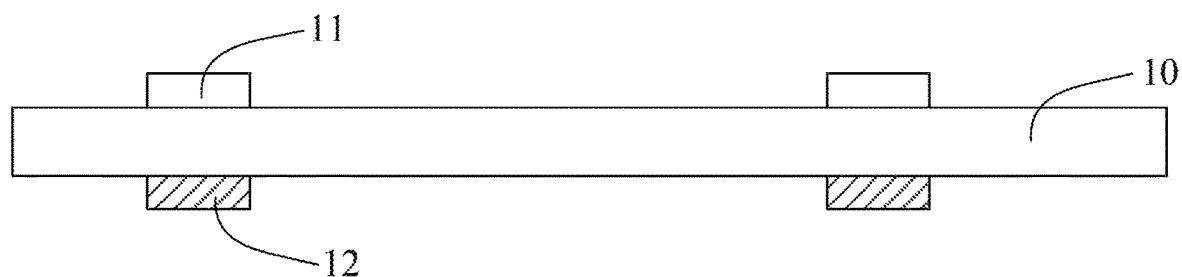
FIG. 1 is an ideal structure diagram of an exposure machine alignment marker according to some embodiments.

Technical solutions in some embodiments of the present disclosure will be described clearly and completely below in combination with accompanying drawings. Obviously, the embodiments to be described are merely some but not all of the embodiments of the present disclosure. All other embodiments obtained by a person of ordinary skill in the art on the basis of the embodiments provided in the present disclosure shall be included in the protection scope of the present disclosure.

Unless the context requires otherwise, the term "comprise/include" and other forms thereof such as the third-person singular form "comprises/includes" and the present participle form "comprising/including" in the description and the claims are construed as open and inclusive, i.e., "inclusive, but not limited to". In the description, the terms such as "one embodiment", "some embodiments", "exemplary embodiments", "example", "specific example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

Hereinafter, the terms "first" and "second" are merely for illustrative purpose, and should not be interpreted as indicating or implying the relative importance or implicitly indicating the number of the specified technical features. Therefore, the features defined by the terms "first" and "second" may explicitly or implicitly include one or more features. In the description of the embodiments of the present disclosure, unless otherwise specified, the phrase "a plurality of" means two or more. Furthermore, the phrase "A and/or B" includes the following three combinations: only A, only B, and a combination of A and B.

At present, the full screen technology has gradually become one of mainstream technologies for handheld display devices such as mobile phones. In a display substrate of a display device, left and right bezels of the display substrate may be narrowed by using of a Gate Driver On Array (abbreviated as GOA) technology, and a lower bezel of the display substrate may be narrowed by a Chip On Film (abbreviated as COF) technology.

In addition, a pixel circuit and other functional circuits (e.g., GOA circuits) required for display are manufactured on a front surface of the display substrate, circuit bonding terminals (e.g., integrated circuit (IC) bonding pads) and a plurality of related signal line traces are manufactured on a back surface of the display substrate. Then, a plurality of connection lines are formed on a side face of the display substrate by a side wiring process, or a plurality of through holes are manufactured in a base of the display substrate (e.g., by a Through-PI Via technology, abbreviated as TPV), so that a metal material may be correspondingly filled in each through hole. In these ways, an electrical connection of corresponding circuits on the front surface and the back surface of the display substrate may be effectively realized, and the bezels of the display substrate may be effectively reduced so as to realize the real bezel-less display.

Therefore, after the pixel circuit and the other functional circuits required for display are manufactured on the base (e.g., on a front surface of the base) of the display substrate, the base is turned over. Before the circuit bonding terminals and the plurality of related signal line traces are manufactured on the back surface of the base, it is necessary to ensure an accurate alignment of the corresponding circuits on the front surface and the back surface of the base, so as to realize a good electrical connection of the corresponding circuits on the front surface and the back surface of the base and ensure the accuracy of transmission of signals.

Figure 2:
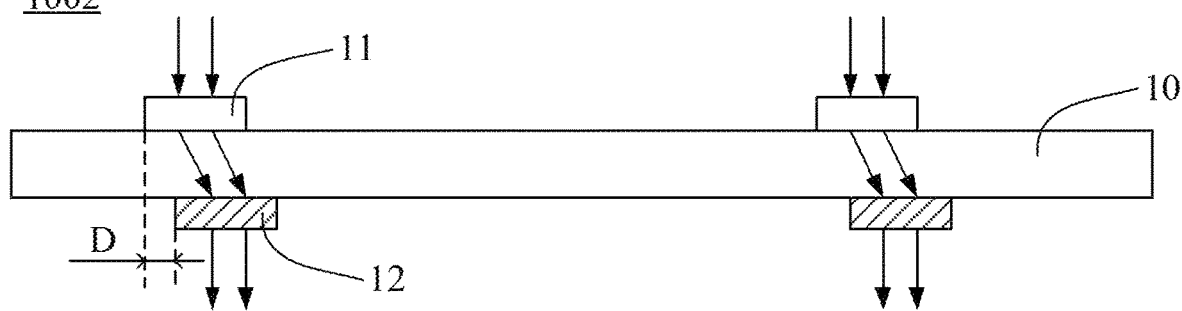
FIG. 2 is an actual structure diagram of an exposure machine alignment marker according to some embodiments.

In some embodiments, as show in FIG. 1, at least one first exposure machine alignment marker 11 is manufactured on, a front surface of a base 10. In a process of manufacturing circuits on a back surface of the base 10, each first exposure machine alignment marker 11 is captured by, an exposure machine, and a second exposure machine alignment marker 12 in one-to-one correspondence to each first exposure machine alignment marker 11 is manufactured on the back surface of the base 10. Thus, each second exposure machine alignment marker 12 may be used as a reference for a manufacture process of the back surface of the base 10, so that a layer pattern is manufactured on the hack surface of the base 10. After each second exposure machine alignment marker 12 is formed on the back surface of the base 10, it is considered that the alignment of the back surface and the front surface of the base 10 is realized. In a case where a process variation between manufacture processes of the back surface and the front surface of the base 10 is zero, i.e., in an ideal case, an orthographic projection of a second exposure machine alignment marker 12 on the base 10 is overlapped with an orthographic projection of a corresponding first exposure machine alignment marker 11 on the base 10. However, any first exposure machine alignment marker 11 is captured by the exposure machine through the base 10. Therefore, after the capturing by the exposure machine, under the influence of the restriction of a depth of field of the exposure machine itself, a refractivity of the base 10 or other causes, it is likely to cause a position offset between the second exposure machine alignment marker 12 that is capable of being formed on the back surface of the base 10 and the corresponding first exposure machine alignment marker 11 in a direction parallel to the back surface of the base 10. This results in an alignment variation D, for example, as shown in FIG. 2.

Further, the alignment variation between the front surface and the back surface of the base 10 will directly affect the signal connectivity in the corresponding circuits on the front surface and the back surface of the base 10. For example, in a manner in which the corresponding circuits are connected by the lines on the side face, the alignment variation will cause a position offset between two bonding terminals of each line located on the front surface and the back surface, so that portions of each line respectively located on the front surface and the back surface have different contact areas, with the base 10, i.e., having different contact resistances.

Thus, it is likely to affect a signal transmission effect of each line. Or, for another example, in a manner in which the corresponding circuits are connected by the TPV technology, the alignment variation will directly lead to the difficulty of accurately connecting the corresponding circuits on the front surface and the back surface of the base 10 through the through holes.

On this basis, some embodiments of the present disclosure provide an alignment mark. With reference to FIGS. 3 to 7, the alignment mark 1001 includes a first alignment marker 1 located on a first surface of a substrate and a second alignment marker 2 located on a second surface of the substrate. The second alignment marker 2 is arranged to be matched with the first alignment marker 1, and the second alignment marker 2 is capable of representing a process variation between the second alignment marker 2 and the first alignment marker 1.

Here, the substrate is a light-transmitting substrate, for example, a glass substrate, a plastic substrate, a polyimide substrate or the like. The first surface and the second surface of the substrate correspond to a front surface and a back surface of the substrate. Here, the first surface is the front surface and the second surface is the back surface, or, the first surface is the back surface and the second surface is the front surface both of which are allowed.

A structure of the first alignment marker may be selectively set according to actual needs. For example, the first alignment marker 1 is a circular mark, or the first alignment marker 1 is composed of two line segments having extension directions perpendicular to each other. The second alignment marker 2 is arranged to be matched with the first alignment marker 1, and a structure of the second alignment marker 2 refers to some following embodiments and is set according to the structure of the first alignment marker 1.

Here, the second alignment marker 2 being capable of representing the process variation between the second alignment marker 2 and the first alignment marker 1 means that, by observing a position variation between the second alignment marker 2 and the first alignment marker 1, the process variation between the second alignment marker 2 and the first alignment marker 1 may be cognized directly and clearly. That is, the alignment accuracy between a process of manufacturing the second alignment marker 2 and a process of manufacturing the first alignment marker 1 may be recognized directly and clearly, or the alignment accuracy between the manufacture processes of the first surface and the second surface of the substrate may be recognized directly and clearly.

Figure 3:
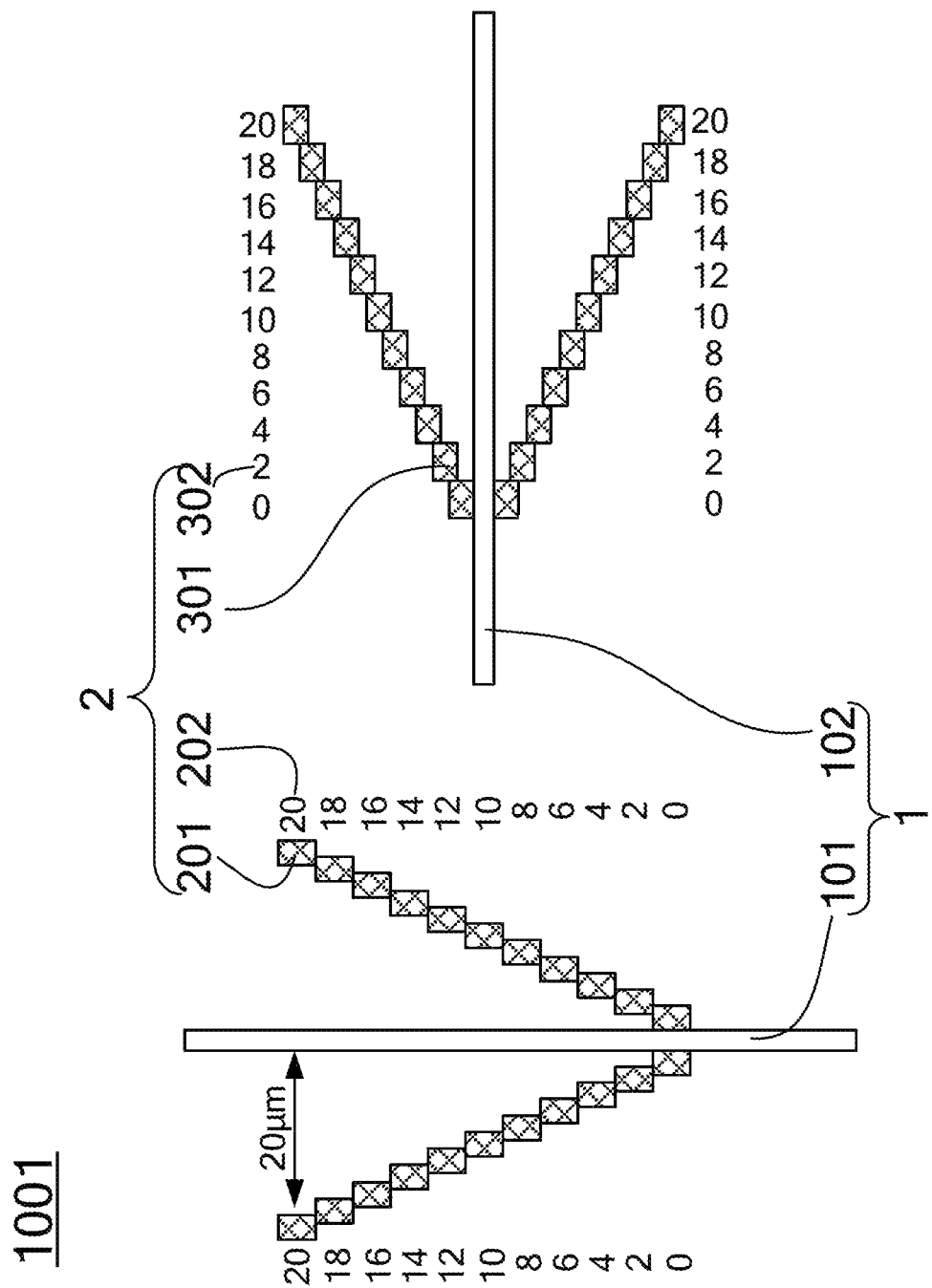
FIG. 3 is an ideal structure diagram of an alignment mark according to some embodiments.

Exemplarily, as shown in FIG. 3, the first alignment marker 1 includes at least one first reference line 101 and at least one second reference line 102. An extension direction of a first reference line 101 is perpendicular or approximately perpendicular to an extension direction of a second reference line 101. The second alignment marker 2 includes a first alignment pattern in one-to-one correspondence to the at least one first reference line 101 and a second alignment pattern in one-to-one correspondence to the at least one second reference line 102.

The following detailed description is given by taking the first alignment marker 1 including a single first reference line 101 and a single second reference line 102 as an example.

With continued reference to FIG. 3, in some embodiments, the first alignment pattern includes a plurality of first alignment blocks 201 distributed in a V shape. A symmetrical centerline of the first alignment pattern is parallel to the first reference line 101. The second alignment pattern includes a plurality of second alignment blocks 301 distributed in a V shape. A symmetrical centerline of the second alignment pattern is parallel to the second reference line 102.

In a case where the alignment variation between the manufacture processes of the first surface and the second surface of the substrate is zero, i.e., in an ideal case, the symmetrical centerline of the first alignment pattern is overlapped with an orthographic projection of the first reference line 101 on the substrate 10, and the symmetrical centerline of the second alignment pattern is overlapped with an orthographic projection of the second reference line 102 on the substrate 10. In a case where the alignment accuracy between the manufacture processes of the first surface and the second surface of the substrate is a certain value, i.e. in an actual case, the symmetrical centerline of the first alignment pattern is offset from the first reference line 101 in a perpendicular direction of the first reference line 101, and the symmetrical centerline of the second alignment pattern, is offset from the second reference line 102 in a perpendicular direction of the second reference line 102.

Figure 5:
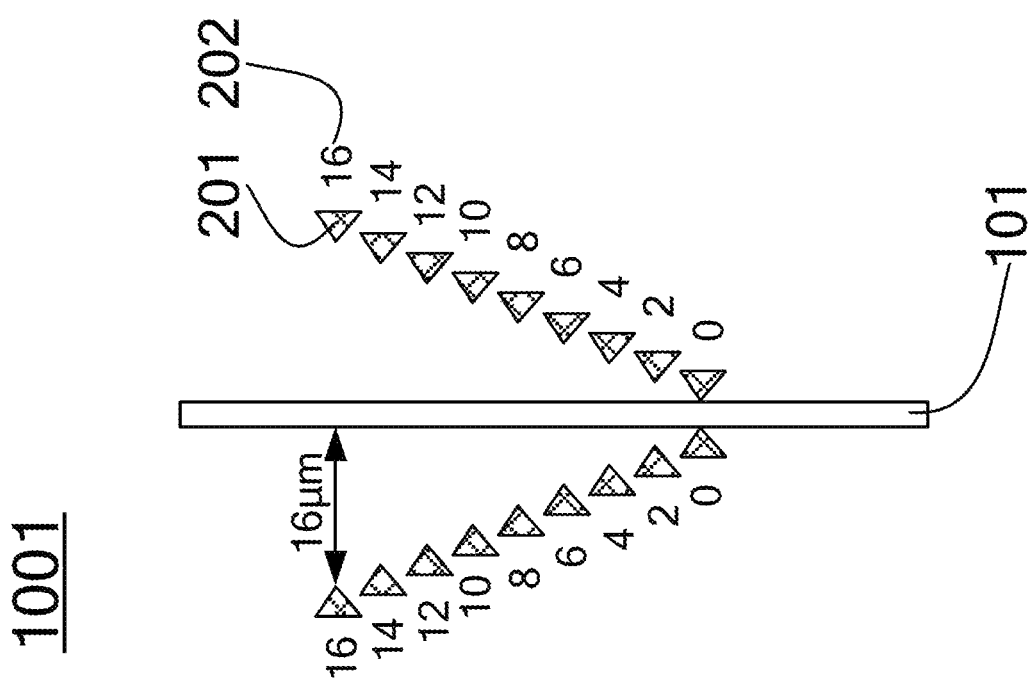
FIG. 5 is a structure diagram of another alignment mark according to some embodiments.
Figure 6:
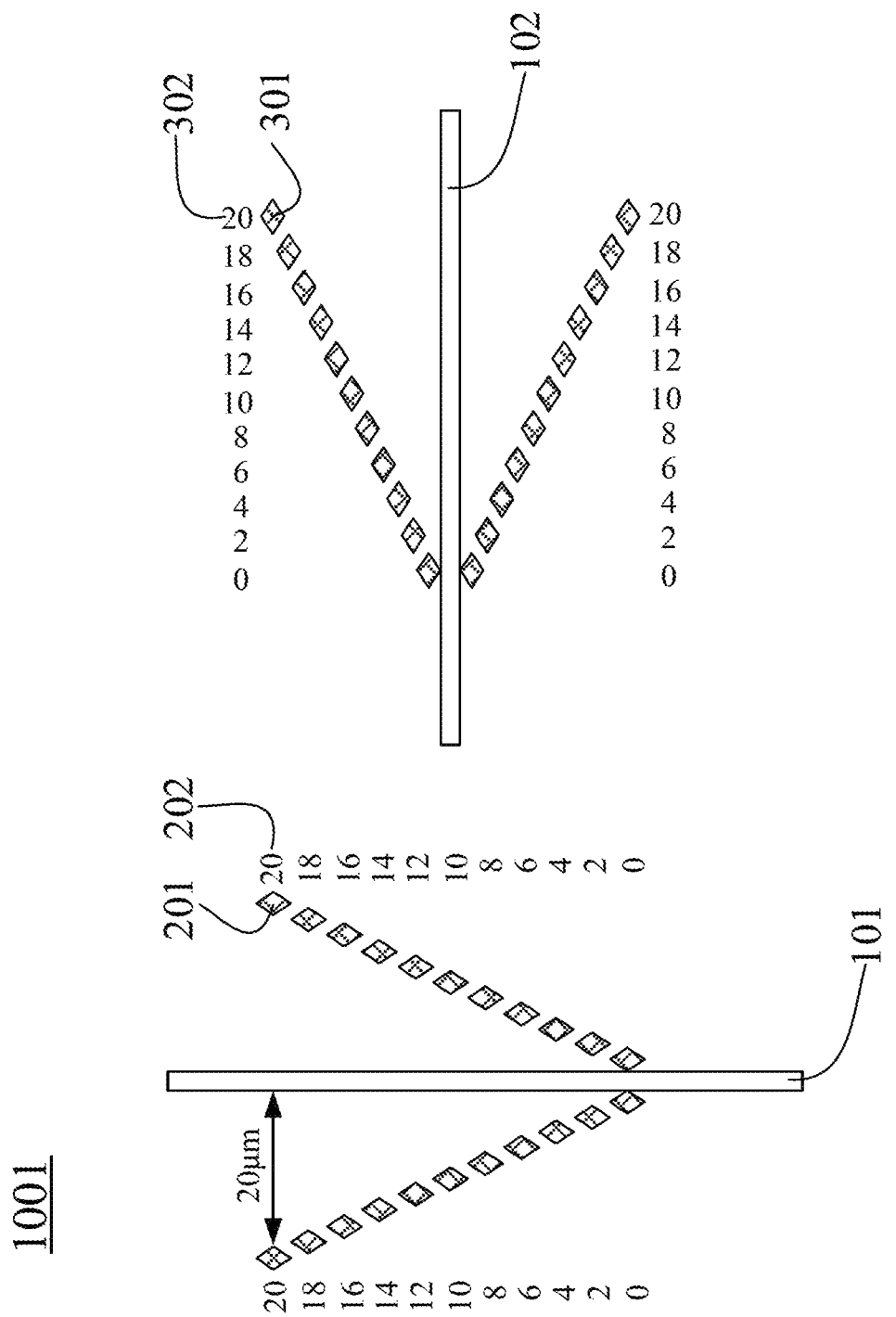
FIG. 6 is a structure diagram of yet another alignment mark according some embodiments.

A shape of each first alignment block 204 and a shape of each second alignment block 301 may be selectively set according to actual needs. Optionally, the shape of each first alignment block 201 includes a rectangle (as shown in FIG. 3), a triangle (as shown in FIG. 5) or a rhombus (as shown in FIG. 6). The shape of each second alignment block 301 includes a rectangle (as shown in FIG. 3), a triangle (as shown in FIG. 5) or a rhombus (as own in FIG. 6). Of course, it is not limited thereto. In some examples, the shapes of each first alignment block 201 and each second alignment block 301 are rectangles, which is advantageous to reduce the difficulty in manufacturing the second alignment marker 2 and to increase the efficiency of manufacturing the second alignment marker 2.

Here, it will be noted that, each first alignment block 201 in a same first alignment pattern is generally the same in shape, and each second alignment block 301 in a same second alignment pattern is generally the same in shape. In a same second alignment marker 2, the first alignment blocks 201 in the first alignment pattern may, be the same as or different from the second alignment blocks 301 in the second alignment pattern in shape, both of which are allowed.

A size of each first alignment block 201 and a size of each second alignment block 301 may be appropriately selected according, to actual needs. Optionally each first alignment block 201 has a dimension within a range from 30 μm to 50 μm in the extension direction of the first reference line 101, and a dimension within a range from 2 μm to 10 μm in the perpendicular direction of the first reference line 101. Each second alignment block 301 has a dimension within a range from 30 μm to 50 μm in the extension direction of the second reference line 102, and a dimension within a range from 2 μm to 10 μm in the perpendicular direction of the second reference line 102. Of course, it is not limited thereto.

It will be noted that, the process variation between the second alignment marker 2 and the first alignment marker 1 will be presented in the form of the offset of the first reference line 101 from the symmetrical centerline of the first alignment pattern and the offset of the second reference line 102 from the symmetrical centerline of the second alignment pattern. Thus, a space between each first alignment block 201 and the symmetrical centerline of the first alignment pattern having this first alignment block 201 (i.e., a distance between a boundary of a first alignment block 201 proximate to the symmetrical centerline and a boundary of the symmetrical centerline proximate to this first alignment block 201) may be used as a measurement reference for the offset of the first reference line 101 from the symmetrical centerline of the first alignment pattern so as to accurately obtain the offset. Similarly, a space between each second alignment block 301 and the symmetrical centerline of the second alignment pattern having this second alignment block 301 (i.e., a distance between a boundary of a second alignment block 301 proximate to the symmetrical centerline and a boundary of the symmetrical centerline, proximate to this second alignment block 301) may be used as a measurement reference for the offset of the second reference line 102 from the symmetrical centerline of the second alignment pattern so as to accurately obtain the offset.

Optionally, in the extension direction of the first reference line 101, for every two adjacent first alignment blocks 201 in a same first alignment pattern, a difference value between a space that is between one first alignment block 201 and the symmetrical centerline of this first alignment pattern (i.e., the first reference line 101 in the ideal case) and a space that is between the other first alignment block 201 and the symmetrical centerline of this first alignment pattern (i.e., the first reference line 101 in the ideal case) is 2 μm. Of course, it is not limited thereto, and a range of the difference value may be appropriately selected according to actual needs. For example, the difference value is, within a range from 0.5 μm to 2 μm. Correspondingly, in the extension direction of the second reference line 102, for every two adjacent second alignment blocks 301 in a same second alignment pattern, a difference value between a space that is between one second alignment block 301 and the symmetrical centerline of this second alignment pattern (i.e., the second reference line 102 in the ideal case) and a space that is between the other second alignment block 301 and the symmetrical centerline of this second alignment pattern (i.e., the second reference line 102 in the ideal case) is 2 μm. Of course, it is not limited thereto, and a range of the difference value may be appropriately selected according to actual needs. For example, the difference value is within a range from 0.5 μm, to 2 μm.

On this basis, a length of the first alignment pattern in the extension direction of the first reference line 101 (related to a number of the first alignment blocks 201 in this first alignment pattern) and a length of the second alignment pattern in the extension direction of the second reference line 102 (related to a number of the second alignment blocks 301 in this second alignment pattern) are selectively determined according to a maximum value of the process variation that may occur between the manufacture processes of the first surface and the second surface of the substrate.

Exemplarily, due to the influence from process devices such as the exposure machine, the maximum value of the process, variation that may occur between the manufacture processes of the first surface and the second surface of the substrate is 20 μm. In a case where the difference value between the spaces between every two adjacent first alignment blocks 201 in a same first alignment pattern and the symmetrical centerline of the first alignment pattern (i.e., the first reference line 101 in the ideal case) is 2 μm and the difference value between the spaces between every two adjacent second alignment blocks 301 in a same second alignment pattern and the symmetrical centerline of the second alignment pattern (i.e., the second reference line 102 in the ideal case) is 2 μm, there are twenty-two first alignment blocks 201 in a same first alignment pattern and twenty-two second alignment blocks 301 in a same second alignment pattern.

Figure 4:
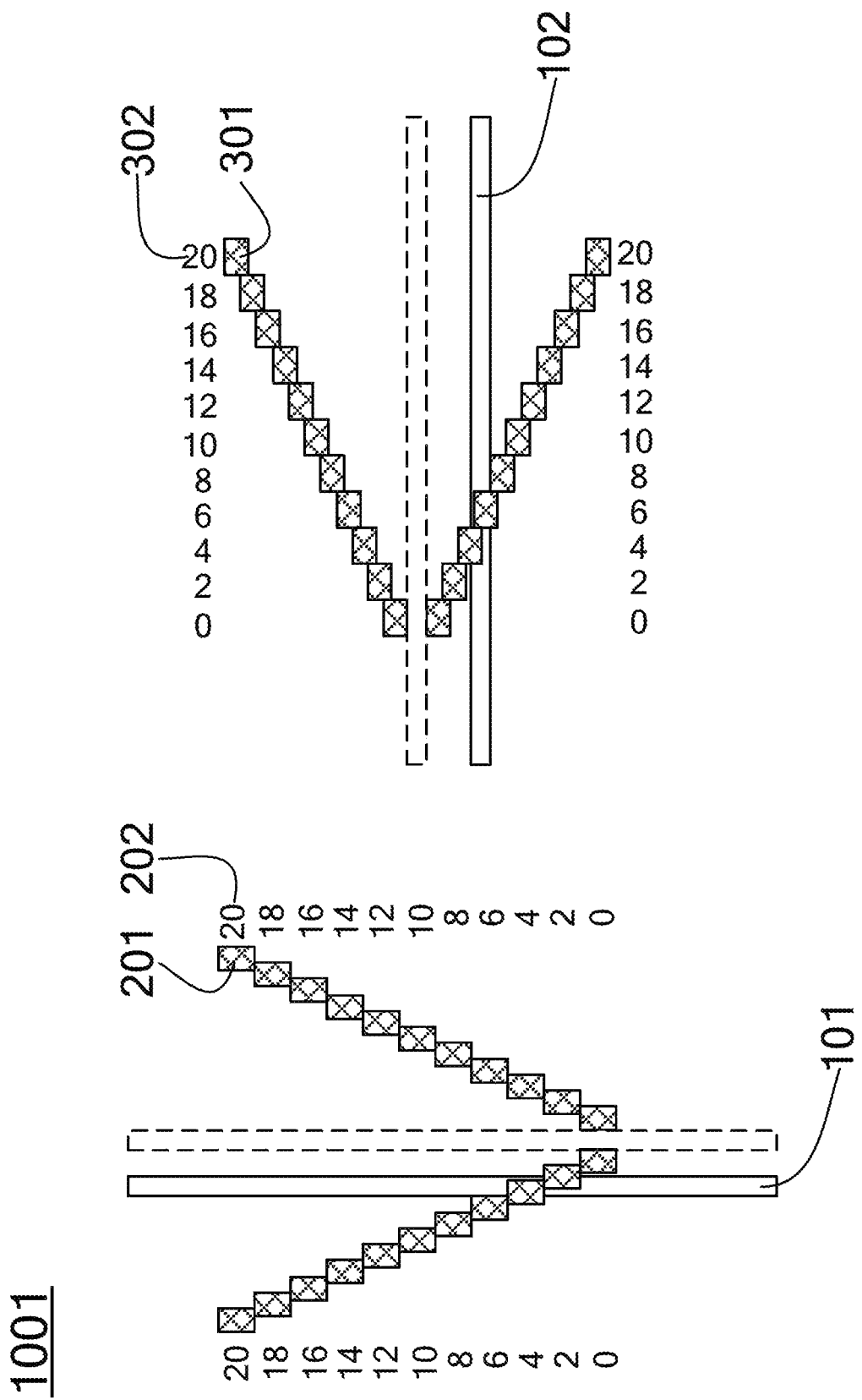
FIG. 4 is an actual structure diagram of the alignment mark shown in FIG. 3.

Thus, in some embodiments, with, reference to FIGS. 3 and 4, in the perpendicular direction of the first reference line 101, a space between two first alignment blocks 201 that are located on a bottom of the V shape, arranged side-by-side and adjacent to each other, in the plurality of first alignment blocks 201 in the first alignment pattern is equal or approximately equal to a line width of the first reference line 101. A space between two first alignment blocks 201 that are located on a top at the V shape, arranged side-by-side and adjacent to each other in the plurality of first alignment blocks 201 in the first alignment pattern is less than or equal to a sulci the line width of the first reference line 101 and 2 times a maximum value of the process variation, for example, the line width of the first reference line 101 plus 40 μm.

Correspondingly, in the perpendicular direction of the second reference line 102, a space between two second alignment blocks 301 that are located on a bottom of the V shape, arranged side-by-side and adjacent to each other in the plurality of second alignment blocks 301 in the second alignment pattern is equal or approximately equal to a line width of the second reference line 102. A space between two second alignment blocks 301 that are located on a top of the V shape, arranged side-by-side and adjacent to each other, in the plurality of second alignment blocks 301 in the second alignment pattern is less than or equal to a sum of the line width of the second reference line 102 and 2 times a maximum value of the process variation, for example, the line width of the second reference line 102 plus 40 μm.

In some embodiments, with reference to FIGS. 3 to 6, the second alignment marker 2 further includes a plurality of first direction displacement value markers 202 located beside the first alignment pattern and a plurality of second direction displacement value markers 302 located beside the second alignment pattern. The plurality of first alignment blocks 201 are in one-to-one correspondence to the plurality of first direction displacement value markers 202, and the plurality of second alignment blocks 301 are in one-to-one correspondence to the plurality of second direction displacement value markers 302.

Here, each first direction displacement value marker 202 is formed beside a corresponding first alignment block 201, In a same first alignment pattern, first direction displacement value markers 202 are distributed uniformly in a same straight line, as shown in FIG. 3; or, first direction displacement value markers 202 are distributed uniformly in a same oblique line, as shown in FIG. 5. Of course, it is not limited thereto. It is also possible that the first direction displacement value markers 202 are distributed dispersedly. Each first direction displacement value marker 202 may be formed in any position as long as the first direction displacement value marker 202 can definitely correspond to each first alignment block 201.

Here, each second direction displacement value marker 302 is formed beside a corresponding second alignment block 301. In a same second alignment pattern, a distribution of the second direction displacement value markers 302 may refer to a distribution of the first direction displacement value markers 202, which not be detailed here.

In some examples, with continued reference to FIGS. 3 to 6, each first direction displacement value marker 202 and each second direction displacement value marker 302 are Arabic numerals or Roman numerals. The first direction displacement value marker 202 is a value of the process variation represented when a space between a corresponding first alignment block 201 and the first reference line 101 is zero or proximate to zero, and the second direction displacement value marker 302 is a value of the process variation represented when a space between a corresponding second alignment block 301 and the second reference line 102 is zero or proximate to zero. Since the first direction displacement value marker 202 and the second direction displacement value marker 302 are Arabic numerals or Roman numerals, a high identification degree may be realized, and it is convenient for identification and reading.

Optionally, a plurality of first direction displacement value markers 202 located on a same side of the symmetrical centerline of the first alignment pattern (i.e., the first reference line 101 in the ideal case) form an arithmetic progression in the extension direction of the reference line 101. That is, in a plurality of first alignment blocks 201 located on a same side of the symmetrical centerline in a same first alignment pattern, in the extension, direction of the first reference line 101, spaces between the first alignment blocks 201 and the symmetrical centerline form an arithmetic progression.

A plurality of second direction displacement value markers 302 located on a same side of the symmetrical centerline of the second alignment pattern (i.e., the second reference line 102 in the ideal case) form an arithmetic progression in the extension direction of the second reference line 102. That is, in a plurality of second alignment blocks are located on a same side of the symmetrical centerline in a same second alignment pattern, in the extension direction of the second reference line 102, spaces between the second alignment blocks 301 and the symmetrical centerline form an arithmetic progression.

Corresponding to the structures of the first alignment pattern and the second alignment pattern in some above embodiments, a difference value between two adjacent first direction displacement value markers 202 in the plurality of first direction displacement value markers 202 is within a range from 0.5 μm to 2 μm, and a difference value between two adjacent second direction displacement value markers 302 in the plurality of second direction displacement value markers 302 is within a range from 0.5 μm to 2 μm.

Exemplarily, as shown FIG. 5, in a plurality of first alignment blocks 201 located on a same side of the symmetrical centerline in a same first alignment pattern, in the extension direction of the first reference line 101, the spaces between the first alignment blocks 201 and the symmetrical centerline are successively 0 μm, 2 μm, 4 μm, 6 μm, 8 μm, 10 μm, 12 μm, 14 μm and 16 μm. That is, the difference value between the spaces between every two first alignment blocks 201 in a same first alignment pattern and the symmetrical centerline of the first alignment pattern is 2 μm. In this way, the plurality of first direction displacement value markers 202 correspondingly located on a same side of the symmetrical centerline of the first alignment pattern are successively 0, 2, 4, 6, 8, 10, 12, 14 and 16 in the extension direction of the first reference line 101.

Similarly, in a plurality of second alignment blocks 301 located on a same side of the symmetrical centerline in a same second alignment pattern, in the extension direction of the second reference line 102, the spaces between the second alignment blocks 301 and the symmetrical centerline are successively 0 μm, 2 μm, 4 μm, μm, 8 μm, 10 μm, 12 μm, 14 μm and 16 μm. That is, the difference value between the spaces between every two second alignment blocks 301 in a same second alignment pattern and the symmetrical centerline of the second alignment pattern is 2 μm. In this way, a plurality of second direction displacement value markers 302 correspondingly located on a same side of the symmetrical centerline of the second alignment pattern are successively 0, 2, 4, 6, 8, 10, 12, 14 and 16 in the extension direction of the second reference line 102.

In conclusion, in a case where the alignment mark 1001 has the structure shown in FIGS. 3 to 6, a corresponding method for manufacturing the alignment mark includes: forming the first alignment marker 1 on the first surface of the substrate, the first alignment marker 1 including the at least one first reference line 101 and the at least one second reference line 102, and forming the second alignment marker 2 on the second surface of the substrate, the second alignment marker 2 including the first alignment pattern in one-to-one correspondence to the at least one first reference line 101, the second alignment pattern in one-to-one correspondence to the at least one second reference line 102, the plurality of first direction displacement value markers 202 located beside the first alignment pattern, and the plurality of second direction displacement value markers 302 located beside the second alignment pattern.

Since the first surface of the substrate is provided with the first exposure machine alignment marker thereon, the first alignment marker 1 and the first exposure machine alignment marker may be formed simultaneously. Then, the first exposure machine alignment marker is captured by the exposure machine on a side where the second surface of the substrate located, and an initial alignment between the manufacture process of the second surface of the substrate and the manufacture process of the first surface of the substrate is performed. Subsequently, the second exposure machine alignment marker and the second alignment marker 2 are simultaneously formed on the second surface of the substrate. In this way, the process variation between the manufacture processes of the first surface and the second surface of the substrate may be accurately determined by observing the correspondence between the second alignment marker 2 and the first alignment marker 1, and it is advantageous to improve the alignment accuracy between the first surface and the second surface of the substrate.

After the alignment mark 1001 is manufactured, as shown in FIGS. 3, 5 and 6, if the process variation between the second alignment marker 2 and the first alignment marker 1 is zero, in the second alignment marker 2, the distribution of the plurality of first alignment blocks 201 is mirror-symmetrical about the first reference line 101 as a symmetrical centerline, and the distribution of the plurality of second alignment blocks 301 is mirror-symmetrical about the second reference line 102 as a symmetrical centerline. Otherwise, as shown in FIG. 4, there is a position offset between the symmetrical centerline of the first alignment pattern and the first reference line 101, and/or there is a position offset between the symmetrical centerline of the second alignment pattern and the second reference line 102.

Exemplarily, as shown in FIG. 4, the first reference line 101 is a vertical line, end the second reference line 102 is a horizontal line. The difference value between two adjacent first direction displacement value markers 202 in the plurality of first direction displacement value markers 202 is 2 μm, that is, the plurality of first direction displacement value markers 202 located on a same side of the symmetrical centerline of the first alignment pattern are successively 0, 2, 4, 6, 8, 10, 12, 14, 16, 18 and 20 in the extension direction of the first reference line 101. The difference value between two adjacent second direction displacement value markers 302 in the plurality of second direction displacement value markers 302 is 2 μm, that is, the plurality of second direction displacement value markers 302 located on a same side of the symmetrical centerline of the second alignment pattern are successively 0, 2, 4, 6, 8, 10, 12, 14, 16, 18 and 20 in the extension direction of the second reference line 102.

Thus, it will be known by observation that a left boundary of the first reference line 101 is overlapped with a right boundary of a first alignment block 201 in a left area in the first alignment pattern, and a space between the first reference line 101 and the first alignment block 201 is zero or proximate to zero. In this case, if a first direction displacement value marker 202 corresponding to this first alignment block 201 is 6, it means that the process variation between the process of manufacturing the second alignment marker 2 and the process of manufacturing the corresponding first alignment marker 1 is 6 μm and a direction of the process variation is horizontally leftward. A lower boundary of the second reference line 102 is overlapped with an upper boundary of a second alignment block 301 in a lower area of the second alignment pattern, and a space between the second reference line 102 and the second alignment block 301 is zero or proximate to zero. In this case, if a second direction displacement value marker 302 corresponding to this second alignment block 301 is 8, it means that the process variation between the process of manufacturing the second alignment marker 2 and the process of manufacturing the corresponding first alignment marker 1 is 8 μm and the direction of the process variation is vertically downward. Thus, the process variation between the manufacture process of the first surface of the substrate and the manufacture process of the second surface of the substrate is 6 μm in horizontally leftward direction and 8 μm in vertically downward direction.

In this way, after structures on the first surface of the substrate is manufactured, a displacement variation is compensated and corrected in the subsequent manufacture process of the second surface of the substrate according to the process variation, for example, by adjusting, exposure parameters for the exposure machine, so that the high alignment accuracy between the manufacture processes of the first surface and the second surface of the substrate may be ensured. Accordingly, it is ensured that the corresponding circuits on the first surface and the second surface of the substrate may be electrically connected well to realize accurate transmission of signals. Further, a production yield of the substrate may be effectively improved on the basis of reducing or eliminating the bezels of the substrate.

After the first alignment marker 1 is manufactured on the first surface of the substrate and structures on the first surface of the substrate is manufactured, the second alignment marker 2 is manufactured on the second surface of the substrate, the structures of the first alignment marker 1 and the second alignment marker 2 are as described in some above embodiments. In this way, by observing a first direction displacement value marker 202 and a second direction displacement value marker 302 corresponding to overlapped parts between the first alignment marker 1 and the second alignment marker 2 (including a part where the space between the both is zero or proximate to zero), the process variation between the manufacture processes of the first surface and the second surface of the substrate may be accurately determined according to the first direction displacement value marker 202 and the second direction displacement value marker 302. Then, the displacement variation is compensated and corrected in the manufacture process of the second surface of the substrate according to the process variation, so that the accurate alignment between the manufacture processes of the first surface and the second surface of the substrate may be realized. Accordingly, the influences from the restriction of the depth of field of the exposure machine itself, the refractivity of the substrate and other causes are reduced, and both the accuracy of signal transmission of the corresponding circuits on the first surface and the second surface of the substrate and the production yield of substrate are effectively improved.

In some embodiments, the substrate is light-transmissive, that is, the substrate has a light transmittance greater than or equal to 90%. A material for each first alignment marker 1 includes a light-shielding material having a light transmittance less than or equal to 10%, and a material for each second alignment marker 2 includes a light-shielding material having a light transmittance less than or equal to 10%. Optionally, the light-shielding material is a metal material, for example, molybdenum, titanium, nickel or the like. In this way, it is convenient to form the first alignment marker 1 and the second alignment marker 2, and it is also convenient to easily recognize the first direction displacement value marker 202 and the second direction displacement value marker 302 corresponding to the overlapped parts between the first alignment marker 1 and the second alignment marker 2 (including the part where the space between the both is zero or proximate to zero) by a direct observation or image acquisition. That is, it is also convenient to easily obtain the process variation between the manufacture processes of the first alignment marker 1 and the second alignment marker 2 by the direct observation or image acquisition.

The structures of the first alignment marker and the second alignment marker 2 may also be designed in other ways. In some other embodiments, with reference to FIG. 7, the first alignment marker 1 is a circular marker, for example, a solid circle. The second alignment marker 2 includes a plurality of circular rings 501 that have a same center and are nested in a radial direction. A circular ring 501 has a minimum inner diameter in the plurality of circular rings 501 is a reference ring, and the inner diameter of the reference ring is equal or approximately equal a diameter of the solid circle.

Optionally, values of inner diameters of the plurality of circular rings 501 form an arithmetic progression, a difference between an outer diameter and an inner diameter of each circular ring 501 is the same or approximately the same, and there is a space between the outer diameter of the circular ring 501 and an inner diameter of another circular ring 501 located, on the outer side of this circular ring 501.

Figure 7:
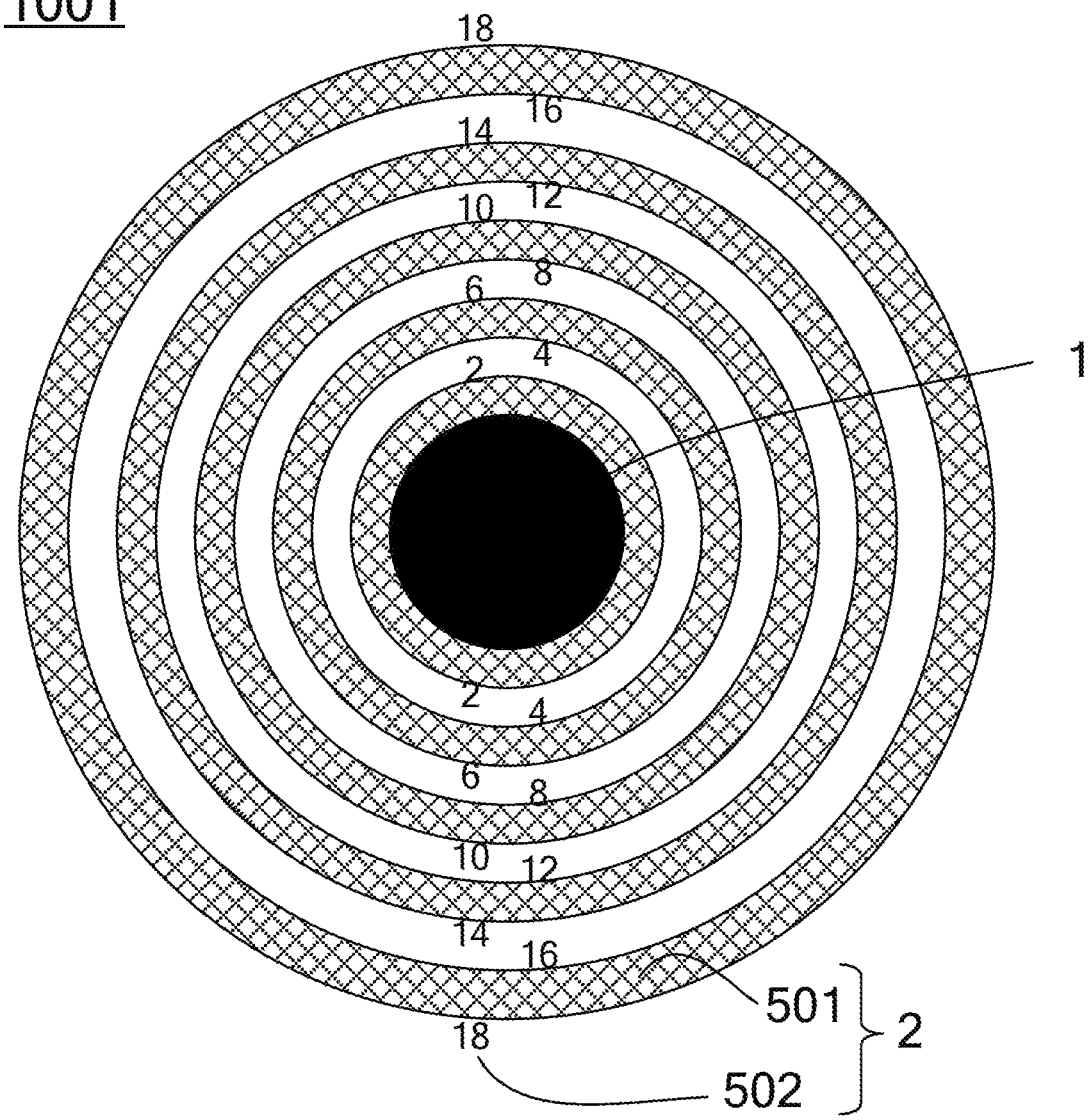
FIG. 7 is a structure diagram of yet another alignment mark according to some embodiments.
Figure 8:
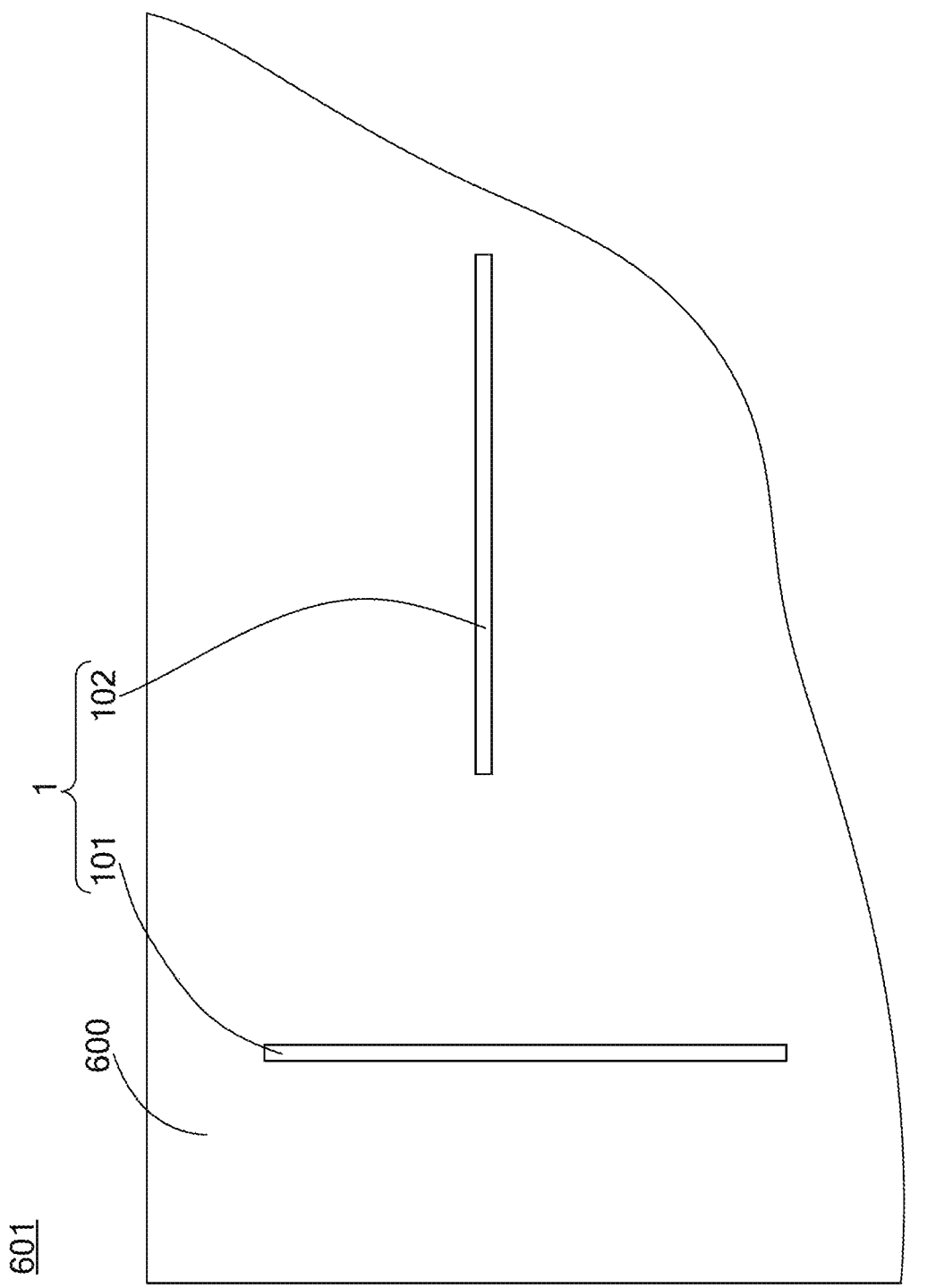
FIG. 8 is a partial structure diagram of a first mask according to some embodiments.
Figure 9:
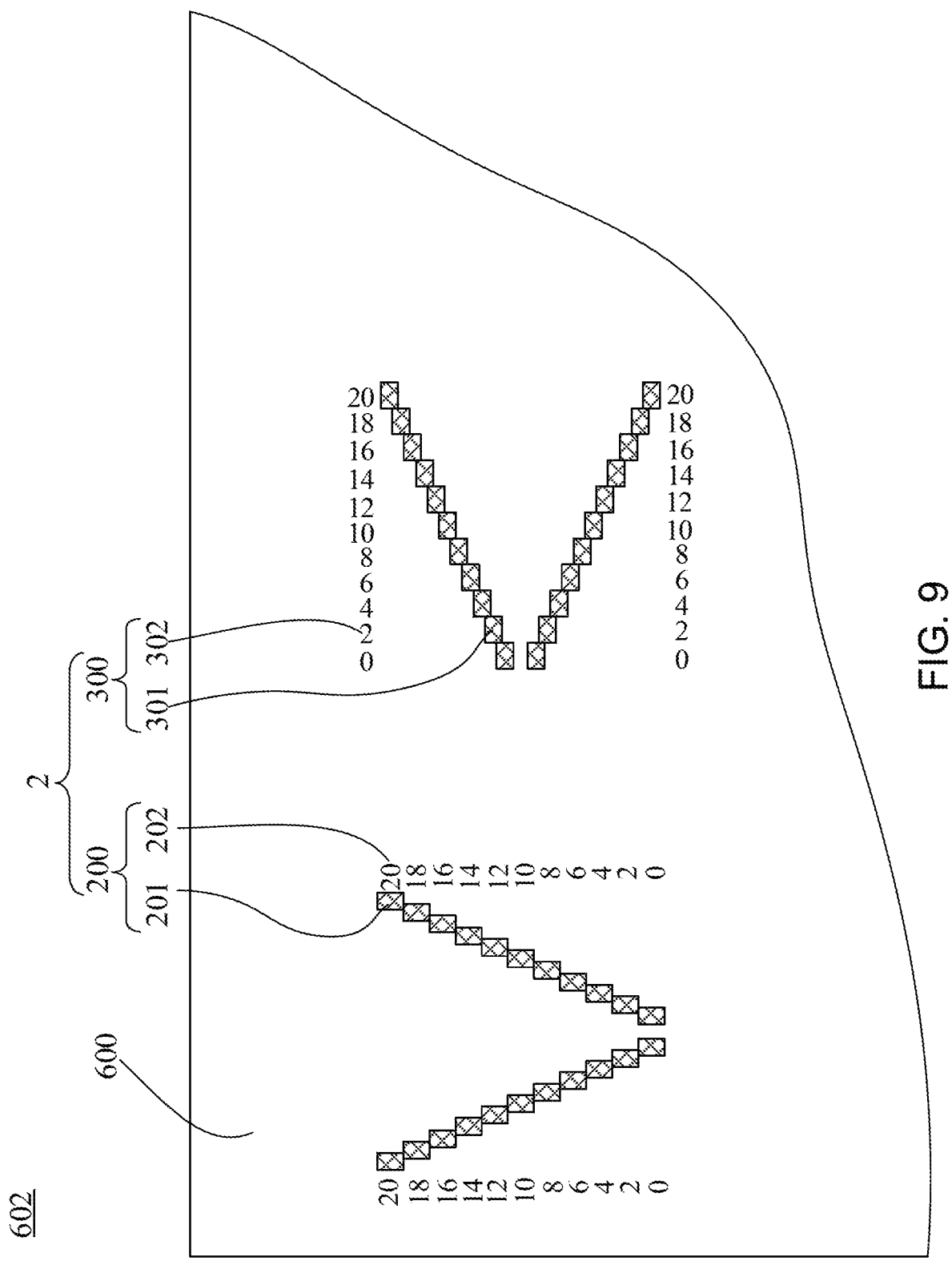
FIG. 9 is a partial structure diagram of second mask according to some embodiments.
Figure 10:
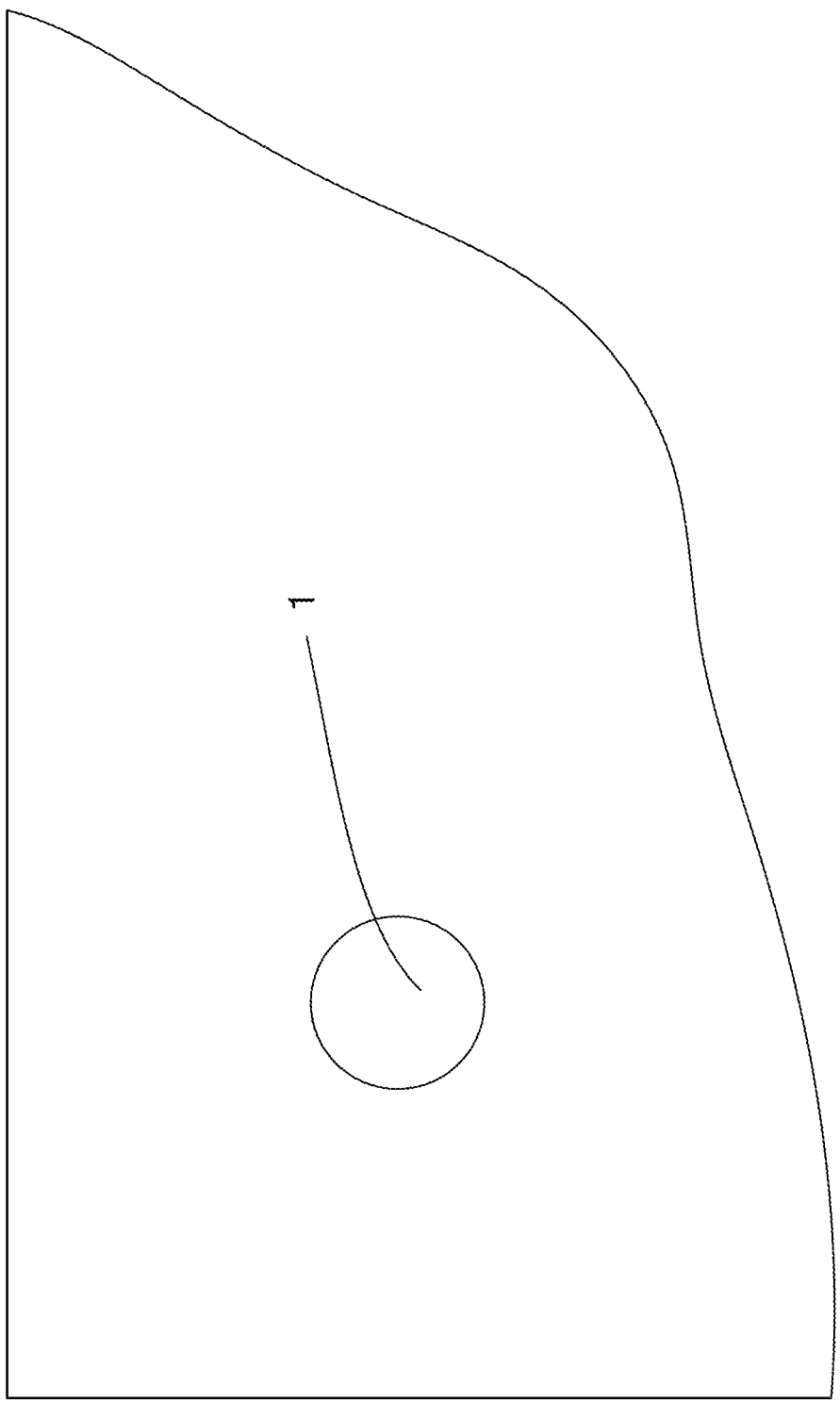
FIG. 10 is a partial structure diagram of another first mask according to some embodiments.
Figure 11:
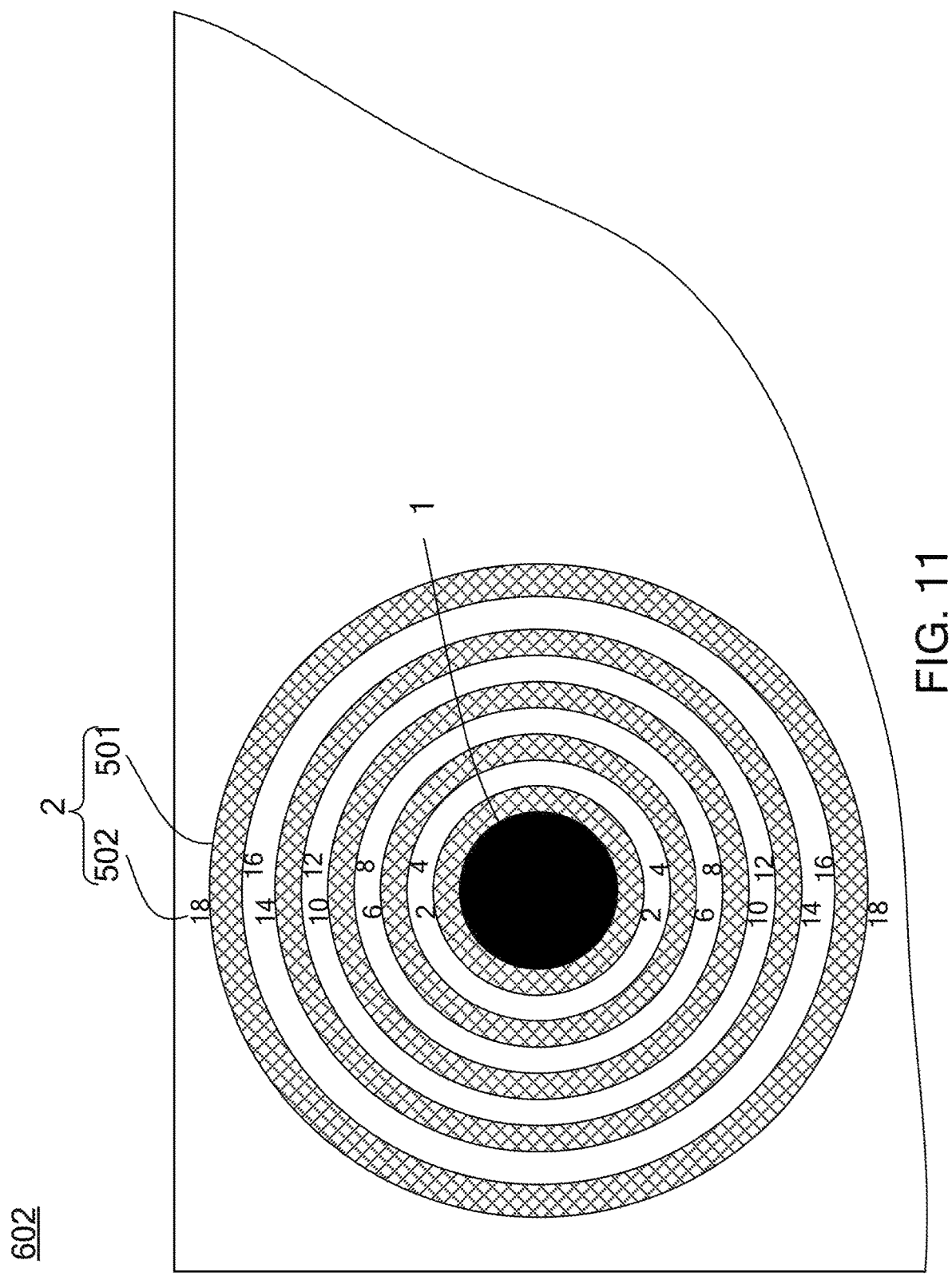
FIG. 11 is a partial structure diagram of another second mask according to some embodiments.

In addition, with continued reference to FIG. 7, optionally, the second alignment marker 2 further includes third displacement value, markers 502 located beside each circular ring 501. Each third displacement value marker 502 is an Arabic numeral or Roman numeral. The third displacement value marker 502 is a value of the process variation represented when a space between an inner diameter or outer diameter of a corresponding circuit ring 501 and an outer diameter of the solid circle is zero or proximate to zero. A formation position of the third displacement value marker 502 may be selectively set according to actual needs, and will not be limited in some embodiments of the present disclosure.

Exemplarily, as shown in FIG. 7, the second alignment marker 2 includes five circular rings, i.e., the reference ring, a first ring, a second ring, a third ring and a fourth ring, respectively. The space between the outer diameter of the circular ring 501 in the second alignment marker 2 and the inner diameter of another circular ring 501 located on the outer side of this circular ring 501 is the same and is 2 μm. In addition, the difference between the outer diameter and the inner diameter of each circular ring 501 is the same and is 2 μm. Thus, a third displacement value marker 502 corresponding to the inner diameter of the reference ring is 0 (not shown), and a third displacement value marker 502 corresponding to the outer diameter of the reference ring is 2. A third displacement value marker 502 corresponding to an inner diameter of the first ring is 4, and a third displacement value marker 502 corresponding to a outer diameter of the first ring is 6. A third displacement value marker 502 corresponding to an inner diameter of the second ring is 8, and a third displacement value marker 502 corresponding to an outer diameter of the second ring is 10. A third displacement value marker 502 corresponding to an inner diameter of the third ring is 12, and a third displacement value marker 502 corresponding to an outer diameter of the third ring is 14. A third displacement value marker 502 corresponding to an inner diameter of the fourth ring is 16, and a third displacement value marker 502 corresponding to an outer diameter of the fourth ring is 18.

Thus, in a case where the process variation between the second alignment marker 2 and the first alignment marker 1 is zero, as shown in FIG. 7, a center of the solid circle coincides with the center of each circular ring 501, and the outer diameter of the solid circle coincides with the inner diameter of the reference ring. In addition, if the outer diameter of the reference ring coincides with the outer diameter of the solid circle, it is indicated that the value of the process variation between the second alignment marker 2 and the first alignment marker 1 in the radial direction is 2 μm. Similarly, it will be known that, if the outer diameter of the solid circle coincides with the inner diameter or outer diameter of a corresponding circular ring, it is indicated that the value of the process variation between the second alignment marker 2 and the first alignment marker 1 in the radial direction is the third displacement value marker 502 corresponding to the inner diameter or outer diameter of this circular ring.

It will be known that the process variation between the second alignment marker 2 and the first alignment marker 1 can be obtained by observing a correspondence between, the solid circle and each circular ring 501. Of course, in a case where the alignment mark 1001 has the structure shown in FIG. 7, the process variation between the second alignment marker 2 and the first alignment marker 1 can be obtained more accurately by means of an angle measuring instrument, for example, a protractor.

Some embodiments of the present disclosure provide a set of masks for use in manufacturing the alignment mark 1001 described in some above embodiments. With reference to FIGS. 8 to 11, the set of masks includes a first mask 601 and a second mask 602. The first mask 601 has a pattern of at least one first alignment marker 1 described in some above embodiments, and the second mask 602 has a pattern of at least one second alignment marker 2 described in some above embodiments. The first alignment marker 1 and the second alignment marker 2 corresponding to each set of masks are matched with each other.

In some embodiments, each of the first mask 601 and the second mask 602 includes a body 600. The pattern of the first alignment marker 1 in the first mask 601 is a hollow pattern disposed in a corresponding body 600. The pattern of the second alignment marker 2 in the second mask 602 is a hollow pattern disposed in a corresponding body 600.

The hollow patterns of both the first mask 601 and the second mask 602 in each set of masks are related to a pattern of the alignment mark 1001 in some above embodiments. A structure of each pattern may refer to e related description in some above embodiments, and will not be repeated here.

It will be noted that, in a case where the second alignment marker 2 includes the plurality of first direction displacement value markers 202 and the plurality of second direction displacement value markers 302, or includes the plurality of third displacement value markers 502, the hollow pattern disposed in the corresponding body 600 in the second mask 802 also includes patterns of corresponding displacement value markers (e.g., the plurality of first direction displacement value markers 202 and the plurality of second direction displacement value markers 302, or the plurality of third displacement markers 502).

The beneficial effects that can be realized by the masks provided in some embodiments of the present disclosure are the as those that can be realized by the alignment mark provided in some above embodiments, and will not be repeated here.

Figure 12:
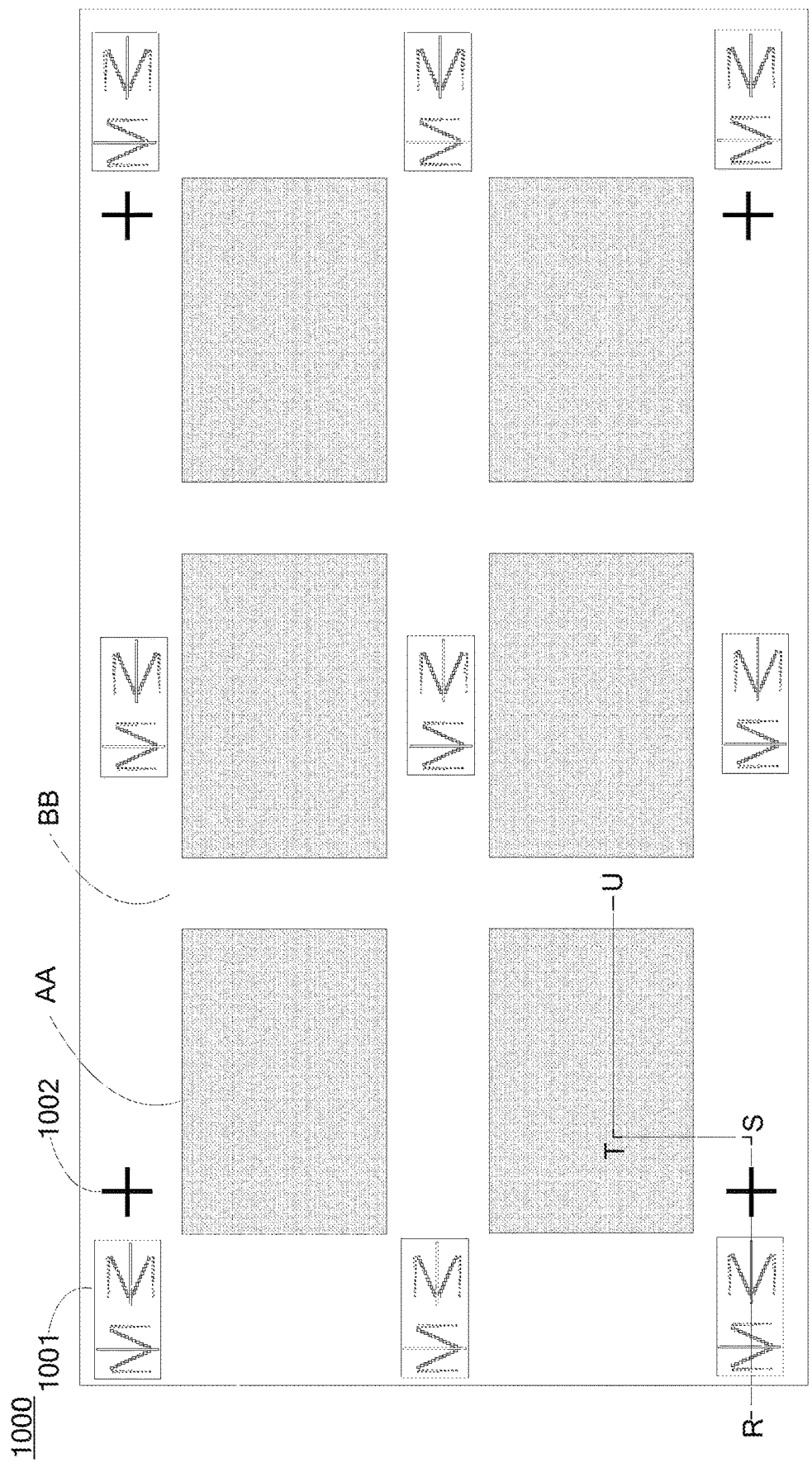
FIG. 12 is a structure diagram of a display substrate motherboard according to some embodiments.
Figure 13:
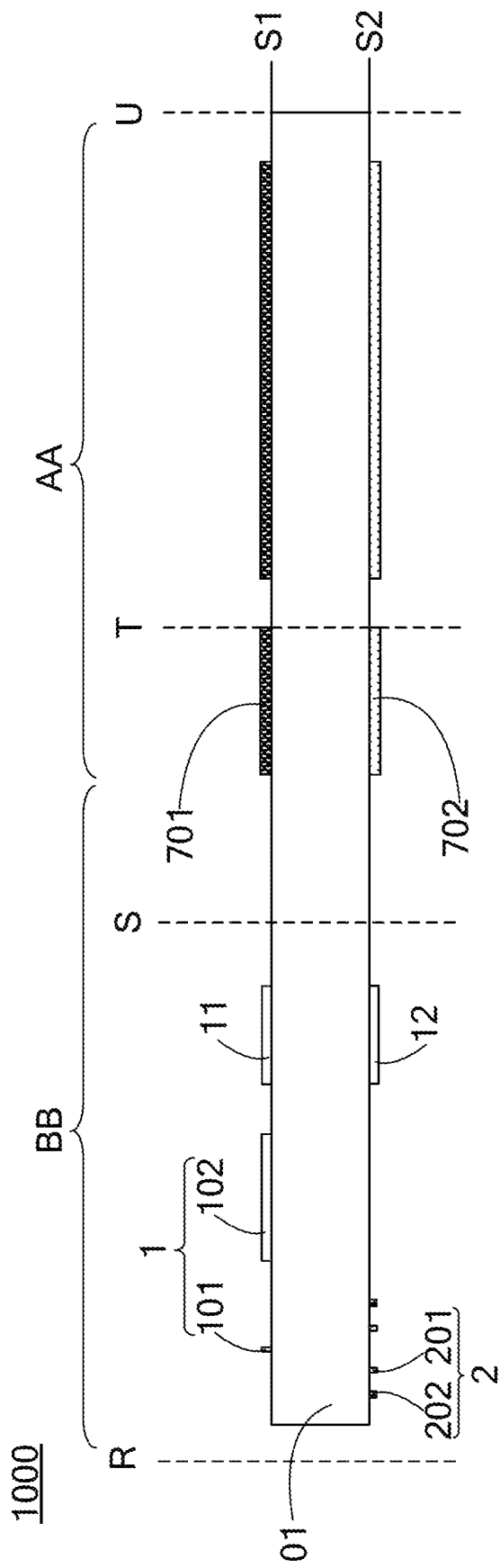
FIG. 13 is a partially sectional view of the display substrate motherboard shown in FIG. 12.

With reference to FIGS. 12 and 13, some embodiments of the present disclosure provide a display substrate motherboard 1000 for manufacturing at least one display substrate. The display substrate motherboard 1000 includes a substrate 01 and at least one alignment mark 1001 described in some above embodiments. The beneficial effects that can be realized by the display substrate motherboard 1000 provided in some embodiments of the present disclosure are the same as those that can be realized by the alignment mark 1001 provided in some above embodiments, and will not be repeated here.

With continued reference to FIGS. 12 and 13, the substrate 01 in the display substrate motherboard 1000 includes at least one display area AA and a non-display area BB located on at least one side of the at least one display area AA. A number of display areas AA in the display substrate motherboard 1000 is the same as a number of display substrates that can be obtained after cutting the display substrate motherboard 1000. The non-display area BB may be located on a single side or a periphery of the display areas AA, and a position of the non-display area BB may be appropriately set according to actual needs.

The alignment mark 1001 in the display substrate motherboard 1000 is located in the non-display area BB. Optionally, there are a plurality of alignment marks 1001 in the display substrate motherboard 1000, and the plurality of alignment marks 1001 are uniformly distributed on the substrate 01.

In addition, the substrate 01 of the display substrate motherboard 1000 is generally provided with at least one exposure machine alignment marker thereon, for example, at least one first exposure machine alignment marker 11 located on a first surface S1 of the substrate 01 and at least one second exposure machine alignment marker 12 located on a second surface S2 of the substrate 01. A shape of the first exposure machine alignment marker 11 and a shape of the second exposure machine alignment marker 12 are related to a structure of the exposure machine. Optionally, the first exposure machine alignment marker 11 and the second exposure machine alignment marker 12 are cross-shaped or rectangular.

It will be noted that, in some embodiments, with reference to FIG. 13, at least one first signal line 701 is disposed on the first surface S1 of the substrate 01, and at least one second signal line 702 is disposed on the second surface S2 of the substrate 01. The first alignment marker 1 in the alignment mark 1001 and the first signal line 701 are disposed in a same layer, and the second alignment marker 2 in the alignment mark 1001 and the second signal line 702 are disposed in a same layer. Thus, it is advantageous to simplify the process of manufacturing the display substrate motherboard 1000.

In addition, the first signal line 701 is directly formed on the first surface S1 of the substrate 01, that is, the first signal line 701 is formed on the first surface S1 of the substrate 01 by a first manufacture procedure. The second signal line 702 is directly formed on the second surface S2 of the substrate 01, that is, the second signal line 702 is formed on the second surface S2 of the substrate 01 by a first manufacture procedure. Types of the first signal line 701 and the second signal line 702 are not limited in some embodiments of the present disclosure, and may be appropriately selected according to actual needs. For example, the first signal line 701 is a gate line, and the second signal line 702 is an electrostatic shielding line.

Of course, in some other embodiments, the first alignment marker 1 in the alignment mark 1001 and a first film on the first surface S1 of the substrate 01 are disposed in a same layer, and the first film is a metal film or other film that is capable of shielding light. The second alignment marker 2 in the alignment mark 1001 and a first film on the second surface S2 of the substrate 01 are disposed in a same layer, and the first film is a metal film or other film that is capable of shielding light. This is also possible, and this is not limited in some embodiments of the present disclosure.

In addition, optionally, the first alignment marker 1 in the alignment mark 1001 and the first exposure machine alignment marker 11 are disposed in a same layer. The second alignment marker 2 in the alignment mark 1001 and the second exposure machine alignment marker 12 are disposed in a same layer. Thus, it is advantageous to simplify the process of manufacturing the alignment markers in the display substrate motherboard 1000.

The expression "two structures disposed in a same layer" may mean that they are made from a same material by one patterning process, or they are made from different materials and located between a same two layers, or they are made from different materials and in direct contact with a same layer. The patterning process includes a photolithography process, or a process including a photolithography process and an etching process. The photolithography process refers to a process including a film formation (e.g., a film formation by chemical vapor deposition (abbreviated as CVD)), an exposure, a development, or the like, and forming a pattern by using a photoresist, a mask, an exposure machine, or the like.

It should be understood that, in a case where the plurality of alignment marks 1001 are disposed in the display substrate motherboard 1000, by observing, the first direction displacement value marker 202 and the second direction displacement value marker 302 corresponding to the overlapped parts between the first alignment marker 1 and the second alignment marker 2 in each alignment mark 1001 (including the part where the space between the both is zero or proximate to zero), an average of process variations can be obtained according to the acquired plurality of first direction displacement value markers 202 and second direction displacement value markers 302, so that the process variation between the manufacture processes of the first surface and the second surface of the substrate 01 is determined more accurately. Thus, the exposure parameters for the exposure machine may be adjusted once according to the process variation between the manufacture processes of the first surface and the second surface of the substrate 01, without adjusting the exposure parameters before each exposure. Accordingly, it is advantageous to improve a process rate of the display substrate motherboard 1000 and thus improve the production efficiency of the display substrate motherboard.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person of skill in the art could readily conceive of changes or replacements within the technical scope disclosed by the present disclosure, which shall all be included in the protection scope of the present disclosure. Therefore, the protection scope of the present disclosure shall be subject to the protection scope of the claims.

What is claimed is:

1. An alignment mark, comprising:
   a first alignment marker located on a first surface of a substrate; and
   a second alignment marker located on a second surface of the substrate;
   wherein the second alignment marker is arranged to be matched with the first alignment marker, and capable of representing a process variation between the second alignment marker and the first alignment marker;
   wherein the first alignment marker includes at least one first reference line and at least one second reference line, and an extension direction of a first reference line is approximately perpendicular to an extension direction of a second reference line,
   wherein the second alignment marker includes:
     a first alignment pattern in one-to-one correspondence to the at least one first reference line and a second alignment pattern in one-to-one correspondence to the at least one second reference line;
     a plurality of first direction displacement value markers located beside the first alignment pattern; and
     a plurality of second direction displacement value markers located beside the second alignment pattern.

2. The alignment mark according to claim 1, wherein a material for the first alignment marker includes a light-shielding material having a light transmittance less than or equal to 10%, and a material for the second alignment marker includes a light-shielding material having a light transmittance less than or equal to 10%.

3. A mask, having a pattern of at least one first alignment marker according to claim 1.

4. A mask, having a pattern of at least one second alignment marker according to any one of claim 1.

5. A display substrate motherboard, comprising:
   a substrate including at least one display area and a non-display area located on at least one side of the at least one display area; and
   at least one alignment mark according to claim 1, located in the non-display area.

6. The display substrate motherboard according to claim 5, wherein
   at least one first signal line is disposed on a first surface of the substrate, and the first alignment marker and the at least one first signal line are disposed in a same layer; and
   at least one second signal line is disposed on a second surface of the substrate, and the second alignment marker and the at least one second signal line are disposed in a same layer.

7. The alignment mark according to claim 1, wherein the first alignment pattern includes a plurality of first alignment blocks distributed in a V shape, and a symmetrical centerline of the first alignment pattern is parallel to the first reference line;
   the second alignment pattern includes a plurality of second alignment blocks distributed in a V shape, and a symmetrical centerline of the second alignment pattern is parallel to the second reference line; and
   the plurality of first alignment blocks are in one-to-one correspondence to the plurality of first direction displacement value markers, and the plurality of second alignment blocks are in one-to-one correspondence to the plurality of second direction displacement value markers.

8. The alignment mark according to claim 7, wherein
   a shape of each of the plurality of first alignment blocks includes a rectangle, a triangle or a rhombus; and
   a shape of each of the plurality of second alignment blocks includes a rectangle, a triangle or a rhombus.

9. The alignment mark according to claim 7, wherein each of the plurality of first alignment blocks has a dimension within a range from 30 gm to 50 μm in the extension direction of the first reference line, and a dimension within a range from 2 μm to 10 gm in a perpendicular direction of the first reference line; and
   each of the plurality of second alignment blocks has a dimension within a range from 30 μm to 50 gm in the extension direction of the second reference line, and a dimension within a range from 2 gm to 10 gm in a perpendicular direction of the second reference line.

10. The alignment mark according to claim 7, wherein
    in a perpendicular direction of the first reference line, a space between two first alignment blocks that are located on a bottom of the V shape, arranged side-by-side and adjacent to each other, in the plurality of first alignment blocks is equal or approximately equal to a line width of the first reference line; and a space between two first alignment blocks that are located on a top of the V shape, arranged side-by-side and adjacent to each other, in the plurality of first alignment blocks is less than or equal to a sum of the line width of the first reference line and 2 times a maximum value of the process variation; and
    in a perpendicular direction of the second reference line, a space between two second alignment blocks that are located on a bottom of the V shape, arranged side-by-side and adjacent to each other, in the plurality of second alignment blocks is equal or approximately equal to a line width of the second reference line; and a space between two second alignment blocks that are located on a top of the V shape, arranged side-by-side and adjacent to each other, in the plurality of second alignment blocks is less than or equal to a sum of the line width of the second reference line and 2 times a maximum value of the process variation.

11. The alignment mark according to claim 7, wherein
    each of the plurality of first direction displacement value markers is an Arabic numeral or Roman numeral, and the first direction displacement value marker is a value of the process variation represented when a space between a corresponding first alignment block and the first reference line is zero or proximate to zero; and
    each of the plurality of second direction displacement value markers is an Arabic numeral or Roman numeral, and the second direction displacement value marker is a value of the process variation represented when a space between a corresponding second alignment block and the second reference line is zero or proximate to zero.

12. The alignment mark according to claim 11, wherein a difference value between two adjacent first direction displacement value markers in the plurality of first direction displacement value markers is within a range from 0.5 μm to 2 pm; and a difference value between two adjacent second direction displacement value markers in the plurality of second direction displacement value markers is within a range from 0.5 μm to 2 μm.

13. An alignment mark, comprising:
a first alignment marker located on a first surface of a substrate; and
a second alignment marker located on a second surface of the substrate, wherein the second alignment marker is arranged to be matched with the first alignment marker, and capable of representing a process variation between the second alignment marker and the first alignment marker; the first alignment marker includes a solid circle; and
the second alignment marker includes a plurality of circular rings that have a same center and are nested in a radial direction, a circular ring having a minimum inner diameter in the plurality of circular rings being a reference ring, and the inner diameter of the reference ring being equal or approximately equal to a diameter of the solid circle.

14. The alignment mark according to claim 13, wherein the second alignment marker further includes third displacement value markers located beside each circular ring; wherein each third displacement value marker is a value of the process variation, in the radial direction, represented when a space between an inner diameter or outer diameter of a corresponding circular ring and an outer diameter of the solid circle is zero or proximate to zero.

15. An alignment mark, comprising:
a first alignment marker located on a first surface of a substrate; and
a second alignment marker located on a second surface of the substrate,
wherein the second alignment marker is arranged to be matched with the first alignment marker, and capable of representing a process variation between the second alignment marker and the first alignment marker;
wherein the first alignment marker includes at least one first reference line and at least one second reference line, wherein an extension direction of a first reference line is perpendicular or approximately perpendicular to an extension direction of a second reference line, the second alignment marker includes a first alignment pattern in one-to-one correspondence to the at least one first reference line and a second alignment pattern in one-to-one correspondence to the at least one second reference line;
the first alignment pattern includes a plurality of first alignment blocks distributed in a V shape, and a symmetrical centerline of the first alignment pattern is parallel to the first reference line; and
the second alignment pattern includes a plurality of second alignment blocks distributed in a V shape, and a symmetrical centerline of the second alignment pattern is parallel to the second reference line.

\* \* \* \* \*